US009487860B2

(12) United States Patent
Gatineau et al.

(10) Patent No.: US 9,487,860 B2
(45) Date of Patent: Nov. 8, 2016

(54) METHOD FOR FORMING COBALT CONTAINING FILMS

(71) Applicant: L'Air Liquide, Société Anonyme pour l'Etude et l'Exploitation des Procédés Georges Claude, Paris (FR)

(72) Inventors: Satoko Gatineau, Tsuchiura (JP); Jean-Marc Girard, Versailles (FR); Nicolas Blasco, Grenoble (FR); Mikiko Kimura, Tsukuba (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 110 days.

(21) Appl. No.: 14/537,708

(22) Filed: Nov. 10, 2014

(65) Prior Publication Data

US 2016/0130699 A1    May 12, 2016

(51) Int. Cl.
| | | |
|---|---|---|
| *C23C 16/06* | (2006.01) | |
| *C23C 16/14* | (2006.01) | |
| *C23C 16/455* | (2006.01) | |
| *C23C 16/50* | (2006.01) | |
| *C23C 16/56* | (2006.01) | |

(52) U.S. Cl.
CPC ......... *C23C 16/45525* (2013.01); *C23C 16/06* (2013.01); *C23C 16/50* (2013.01); *C23C 16/56* (2013.01)

(58) Field of Classification Search
CPC .............................. C23C 16/06; C23C 16/14
See application file for complete search history.

(56) References Cited

U.S. PATENT DOCUMENTS

| | | | |
|---|---|---|---|
| 4,748,045 A | 5/1988 | Ehrlich et al. | |
| 4,814,294 A | 3/1989 | West et al. | |
| 5,171,610 A | 12/1992 | Liu | |
| 6,346,477 B1* | 2/2002 | Kaloyeros | C23C 16/42 257/E21.165 |
| 6,444,263 B1* | 9/2002 | Paranjpe | C23C 16/0281 427/250 |
| 2004/0005753 A1* | 1/2004 | Kostamo | C23C 16/40 438/222 |
| 2004/0203233 A1* | 10/2004 | Kang | C23C 16/16 438/686 |
| 2007/0105377 A1* | 5/2007 | Koos | C23C 18/1608 438/689 |
| 2008/0026149 A1* | 1/2008 | Tomasini | C23C 16/04 427/255.28 |
| 2008/0085611 A1* | 4/2008 | Khandelwal | H01L 21/28556 438/785 |
| 2008/0132050 A1 | 6/2008 | Lavoie | |
| 2009/0053426 A1 | 2/2009 | Lu et al. | |
| 2009/0269507 A1 | 10/2009 | Yu et al. | |
| 2009/0283499 A1* | 11/2009 | Mayer | C23C 18/1608 216/90 |
| 2011/0124192 A1 | 5/2011 | Ganguli et al. | |
| 2012/0252207 A1 | 10/2012 | Lei et al. | |
| 2013/0001515 A1* | 1/2013 | Li | H01L 21/0242 257/24 |
| 2013/0189840 A1 | 7/2013 | Fu et al. | |
| 2014/0255606 A1 | 9/2014 | Thompson et al. | |

FOREIGN PATENT DOCUMENTS

WO    WO 2009 134925    11/2009

OTHER PUBLICATIONS

Ivanova, Ana R., et al., "The Effects of Processing Parameters in the Chemical Vapor Deposition of Cobalt from Cobalt Tribcarbonyl Nitrosyl". Journal of The Electrochemical Society, 146 (6) 2139-2145 (1999).*
Lane, Penelope A., "Metal Organic CVD of Colbalt Thin Films Using Cobalt Tricarbonyl Nitrosyl". Chemical Vapor Deposition 1998, 4, No. 5, pp. 183-186.*
Klesko, Joseph P., et al., "Low Temperature Thermal Atomic Layer Deposition of Cobalt Metal Films". Chemistry of Materials, 2016, 28, 700-703.*
Deo, N. et al., "Chemical vapour deposition of cobalt for magnetic applications," Proceedings, Electrochemical Society (2003), Aug. 2003 (Chemical Vapor Desposition XVI and EUROCVD 14, vol. 2), 1008-1015. (Abstract only.).
Ivanova, A.R. et al., "The effects of processing parameters in the chemical vapor deposition of cobalt from cobalt tricarbonyl nitrosyl," Journal of the Electrochemical Society, 146 (6) 2139-2145 (1999).
Londergan, A.R., "Interlayer mediated epitaxy of cobalt silicide on silicon (100) from low temperature chemical vapor deposition of cobalt," Journal of the Electrochemical Society, 148 (1) C21-C27 (2001).
Rosenberg, S.G., et al., "Electron beam induced reactions of absorbed cobalt tricarbonyl nitrosyl (Co(CO)3NO) molecules," Journal of Physical Chemistry C, 2013, 117, 16053-16064.
Yang, C-C, et al., "Characterization of Selectively Deposited Cobalt Capping Layers: Selectivity and Electromigration Resistance," IEEE Electron Device Letters, vol. 31, No. 7, 728-730, Jul. 2010.
Rem, J.B. et al., "Incubation time measurements in thin-film deposition," J. Electrochem. Soc., vol. 144, No. 6, Jun. 1997, 2101-2106.

* cited by examiner

*Primary Examiner* — Bret Chen
(74) *Attorney, Agent, or Firm* — Patricia E. McQueeney

(57) ABSTRACT

Vapor deposition methods of cobalt-containing films by using cobalt carbonyl nitrosyl are disclosed.

5 Claims, 12 Drawing Sheets

METHOD FOR FORMING COBALT CONTAINING FILMS

TECHNICAL FIELD

Vapor deposition methods, including selective deposition, of cobalt-containing films by using cobalt carbonyl nitrosyl are disclosed.

BACKGROUND

Chemical Vapor Deposition (CVD) and Atomic Layer Deposition (ALD) have been applied as vapor deposition techniques for producing thin films for semiconductor devices.

Films of metal and metal silicide, particularly manganese, iron, cobalt, nickel, and ruthenium, are becoming important for a variety of electronics and electrochemical applications. For example, cobalt thin films are of interest due to their high magnetic permittivity. There are many reports of using cobalt thin films to form cobalt disilicide ($CoSi_2$) for Ohmic contacts owing to its low resistivity in front-end-of-the-line processing of semiconductor devices. Cobalt containing thin films have been recently studied as Cu/low-k barriers, passivation layers, and capping layers for ultra large scale integrated devices.

Cobalt tricarbonyl nitrosyl, $Co(CO)_3(NO)$, is a known precursor used to form cobalt containing films. See, e.g., U.S. Pat. No. 4,748,045 to Ehrlich et al. and U.S. Pat. No. 6,444,263 to Paranjpe et al.

Cobalt containing film vapor deposition using Co-containing precursors, including $Co(CO)_3(NO)$, on copper and barrier layers, such as Ta, TaN, Ti, TiN, W, and WN, is also encompassed within the disclosures of PCT Pat App Pub WO2009/134925 to Yu et al. and US Pat App Pub Nos 2009/0269507 to Yu et al.; 2009/0053426 to Lu et al.; S. Ganguli et al, US2011/0124192; US2012/0252207) to Lei et al.

US 2008/0132050 to Lavoie discloses a method of forming a graded cobalt-containing barrier layer by forming a Co metal layer atop a CoN layer using any of at least 37 different Co-containing precursors, including $Co(CO)_3(NO)$, in any combination of PVD, ALD, or CVD processes followed by annealing.

Chemical vapor deposition of Cobalt from $Co(CO)_3(NO)$ has been studied and reported (A. R. Ivanova et al, J. Electrochem. Soc, 146 (6) 2139-2145, 1999; A. R. Ivanova et al, J. Electrochem. Soc., 148(1) C21-C27, 2001; Deo et al., Proceedings—Electrochemical Society (2003), 2003-8 (Chemical Vapor Deposition XVI and EUROCVD 14, Volume 2), 1008-1015). As reported in these articles, a temperature greater than 300° C. was necessary to obtain almost 100% cobalt film.

A need remains for processes to rapidly form pure cobalt films at low temperatures.

Notation and Nomenclature

Certain abbreviations, symbols, and terms are used throughout the following description and claims, and include:

As used herein, the indefinite article "a" or "an" means one or more; the terms "approximately" or "about" mean±10% of the value stated; and the term "selective deposition" means to deposit the desired layer on one surface of a multi-surface substrate (e.g., depositing a Co layer on a Si surface of a substrate, but not on the Pd surface of the same substrate).

As used herein, "first" and "second" denote a sequential order or two different layers on a substrate.

As used herein, the abbreviation "CVD" refers to chemical vapor deposition, the abbreviation "PECVD" refers to plasma enhanced chemical vapor deposition, the abbreviation "ALD" refers to atomic layer deposition, the abbreviation "PEALD" refers to plasma enhanced atomic layer deposition, the abbreviation "PVD" refers to physical vapor deposition, the abbreviation "XPS" refers to X-ray Photoelectron Spectroscopy, and the abbreviation "SEM" refers to scanning electron microscope/microscopy.

The standard abbreviations of the elements from the periodic table of elements are used herein. It should be understood that elements may be referred to by these abbreviations (e.g., Co refers to cobalt, Si refers to silicon, C refers to carbon, etc.).

SUMMARY

Methods of forming a cobalt-containing layer on a substrate contained in a reactor are disclosed. The substrate is heated to a temperature ranging from approximately 25° C. to approximately 300° C. A nucleation layer is produced on the substrate by a first vapor deposition process having a first deposition rate below 2 nm/min by introducing a vapor of $Co(CO)_3(NO)$ and a reducing gas into the reactor. The remaining portion of the cobalt-containing layer is produced on the nucleation layer by a second vapor deposition process having a second deposition rate higher than 2 nm/min by introducing the vapor of $Co(CO)_3(NO)$ and the reducing gas into the reactor. The first deposition rate increases to the second deposition rate by increasing the temperature of the substrate, by increasing partial pressure of the vapor of $Co(CO)_3(NO)$, by increasing a pressure of the reactor, and/or by changing from a sequential first vapor deposition process to a non-sequential second vapor deposition process. The disclosed method may include one or more of the following aspects:

- the reducing gas being the same in the first vapor deposition process and second vapor deposition process;
- the reducing gas being different in the first vapor deposition process and second vapor deposition process;
- switching from the first vapor deposition process to the second vapor deposition process after a predetermined number of ALD cycles;
- switching from the first vapor deposition process to the second vapor deposition process after a predetermined time;
- the first vapor deposition process using plasma;
- the second vapor deposition process using plasma;
- the first vapor deposition process not being photodeposition;
- the second vapor deposition process not being photodeposition;
- the first vapor deposition process not being initiated by a light beam;
- the second vapor deposition process not being initiated by a light beam;
- the first vapor deposition process being a sequential vapor deposition process;
- the second vapor deposition process being a non-sequential vapor deposition process;
- the non-sequential vapor deposition process being CVD or PECVD;
- the non-sequential vapor deposition process being CVD;
- the non-sequential vapor deposition process being PECVD;

the first deposition rate being below 1 nm/min;
the first deposition rate being below 0.5 nm/min;
annealing the nucleation layer under a reducing atmosphere at a temperature between 100° C. and 500° C.;
annealing the nucleation layer under a reducing atmosphere at a temperature between 250° C. and 500° C.;
the annealed nucleation layer containing approximately 90 atomic % to 100 atomic % Co;
the annealed nucleation layer having a resistivity lower than 500 µΩ cm; and
the annealed nucleation layer having a resistivity lower than 200 µΩ cm.

Also disclosed are methods of forming a cobalt-containing layer on a substrate contained in a reactor. The substrate is heated to a temperature ranging from approximately 25° C. to approximately 300° C. A nucleation layer is produced on the substrate by a first vapor deposition process having a first deposition rate below 2 nm/min by introducing a vapor of Co(CO)$_3$(NO) and a reducing gas into the reactor. The first deposition rate is increased to a second deposition rate higher than 2 nm/min to produce a remaining section of the cobalt-containing layer on the nucleation layer by increasing the temperature of the substrate, by increasing a partial pressure of the vapor of Co(CO)$_3$(NO), by increasing a pressure of the reactor, and/or by changing from a sequential first vapor deposition process to a non-sequential second vapor deposition process. The disclosed method may include one or more of the following aspects:

the reducing gas being the same in the first vapor deposition process and the deposition rate increasing step;
the reducing gas being different in the first vapor deposition process and the deposition rate increasing step;
switching from the first vapor deposition process to the deposition rate increasing step after a predetermined number of ALD cycles;
switching from the first vapor deposition process to the deposition rate increasing step after a predetermined time;
the first vapor deposition process using plasma;
the deposition rate increasing step using plasma;
the first vapor deposition process not being photodeposition;
the deposition rate increasing step not being photodeposition;
the first vapor deposition process not being initiated by a light beam;
the deposition rate increasing step not being initiated by a light beam;
the first vapor deposition process being a sequential vapor deposition process;
the deposition rate increasing step being a non-sequential vapor deposition process;
the non-sequential vapor deposition process being CVD or PECVD;
the non-sequential vapor deposition process being CVD;
the non-sequential vapor deposition process being PECVD:
the first deposition rate being below 1 nm/min;
the first deposition rate being below 0.5 nm/min;
annealing the nucleation layer under a reducing atmosphere at a temperature between 100° C. and 500° C.;
annealing the nucleation layer under a reducing atmosphere at a temperature between 250° C. and 500° C.;
the annealed nucleation layer containing approximately 90 atomic % to 100 atomic % Co;
the annealed nucleation layer having a resistivity lower than 500 µΩ cm; and
the annealed nucleation layer having a resistivity lower than 200 µΩ cm.

Also disclosed are methods of forming a cobalt-containing layer on a substrate contained within a reactor. The substrate is heated to a temperature ranging from approximately 25° C. to approximately 300° C. A vapor deposition process is performed in the reactor to deposit a portion of the cobalt-containing layer on the substrate by sequentially exposing the substrate to a vapor of Co(CO)$_3$(NO) and a reducing gas at a pressure ranging from approximately 0.1 Torr to approximately 10 Torr. A chemical vapor deposition process is performed in the reactor to deposit a remaining portion of the cobalt-containing layer on the portion of the cobalt-containing layer by simultaneously introducing the reducing gas and the vapor of Co(CO)$_3$(NO) into the reactor at a pressure ranging from approximately 3 Torr to approximately 30 Torr. The disclosed method may include one or more of the following aspects:

the reducing gas being the same in the vapor deposition process and the chemical vapor deposition process;
the reducing gas being different in the vapor deposition process and the chemical vapor deposition process;
switching from the vapor deposition process to the chemical vapor deposition process after a predetermined number of ALD cycles;
switching from the vapor deposition process to the chemical vapor deposition process after a predetermined time;
the vapor deposition process using plasma;
the chemical vapor deposition process using plasma;
the vapor deposition process not being photodeposition;
the chemical vapor deposition process not being photodeposition;
the vapor deposition process not being initiated by a light beam;
the chemical vapor deposition process not being initiated by a light beam;
the vapor deposition process being a sequential vapor deposition process;
the chemical vapor deposition process being PECVD
annealing the portion of the cobalt-containing layer under a reducing atmosphere at a temperature between 100° C. and 500° C.;
annealing the portion of the cobalt-containing layer under a reducing atmosphere at a temperature between 250° C. and 500° C.;
the annealed portion of the cobalt-containing layer containing approximately 90 atomic % to 100 atomic % Co;
the annealed portion of the cobalt-containing layer having a resistivity lower than 500 µΩ cm; and
the annealed portion of the cobalt-containing layer having a resistivity lower than 200 µΩ cm.

Also disclosed are methods of selectively depositing cobalt-containing layers on a substrate contained in a reactor. The vapor of Co(CO)$_3$(NO) and a reactant are introduced into a reactor containing a substrate having a first layer and a second layer thereon. The cobalt-containing layer is selectively deposited on the first layer via an atomic layer deposition or pulsed chemical vapor deposition process. The disclosed methods may include one or more of the following aspects:

the incubation time for depositing the cobalt-containing layer on the first layer is shorter than the incubation time for depositing the cobalt-containing layer on the second layer;
the process being an atomic layer deposition process;

the process being a pulsed chemical vapor deposition process;

the vapor of $Co(CO)_3(NO)$ chemisorbing on the first layer;

the vapor of $Co(CO)_3(NO)$ not chemisorbing on the second layer;

the vapor of $Co(CO)_3(NO)$ chemisorbing on the first layer and the second layer to form a first chemisorbed layer and a second chemisorbed layer, respectively;

the reactant reacting with the first chemisorbed layer;

the reactant not reacting with the second chemisorbed layer;

the two or more layers including Cu, Pt, Si, and/or $SiO_2$;

the first layer being Si;

the first layer being $SiO_2$;

the first layer being Cu;

the second layer being Cu;

the second layer being Pt;

selectively depositing the cobalt-containing layers on the Si and/or $SiO_2$ layers faster than on the Cu and/or Pt layers;

the reactant being $H_2$;

the atomic layer deposition process not including plasma; and the atomic layer deposition process being performed at a temperature ranging from approximately 25° C. to approximately 110° C.

Any of the disclosed methods above may include one or more of the following aspects:

the $Co(CO)_3(NO)$ having a purity between approximately 95% w/w and 100% w/w;

the $Co(CO)_3(NO)$ having a purity greater than 98% w/w;

the reducing gas being selected from the group consisting of $N_2$, $H_2$, $NH_3$, $SiH_4$, $Si_2H_6$, $Si_3H_8$, $(Me)_2SiH_2$, $(C_2H_5)_2SiH_2$, $(CH_3)_3SiH$, $(C_2H_5)_3SiH$, $[N(C_2H_5)_2]_2SiH_2$, $N(CH_3)_3$, $N(C_2H_5)_3$, $(SiMe_3)_2NH$, $H_2NNH_2$, $(CH_3)HNNH_2$, $(CH_3)_2NNH_2$, phenyl hydrazine, $B_2H_6$, $(SiH_3)_3N$, $HAlMe_2$, $H_3AlNEt_2Me$, $H_3AlNMe_3$, $(BH_4)AlH_2NMe_3$, $H_3Al(Me-NC_4H_8)$, other alanes, radical species thereof, and mixtures thereof;

the reducing gas being $H_2$ or $NH_3$;

the reducing gas being $H_2$;

the reducing gas being $NH_3$;

the reducing gas having a partial pressure between approximately 100 Pa and approximately 2500 Pa;

the reducing gas having a partial pressure between approximately 650 Pa and approximately 1500 Pa;

the $Co(CO)_3(NO)$: reducing gas ratio in a reactor being approximately 1:1000 to approximately 1:10;

the $Co(CO)_3(NO)$: reducing gas ratio in a reactor being approximately 1:500 to 1:100;

the $Co(CO)_3(NO)$: reducing gas ratio in a reactor being approximately 1:500 to 1:200;

the substrate temperature being between approximately 30° C. and approximately 300° C.;

the substrate temperature being between approximately 50° C. and approximately 200° C.;

the substrate temperature being between approximately 100° C. and approximately 300° C.;

the substrate temperature being between approximately 150° C. and approximately 300° C.;

the substrate being selected from the group consisting of Si, $SiO_2$, metallic films, nitride films, carbonitride films, oxide films and dielectric films;

the substrate being Si, $SiO_2$, Cu, or Pt;

the substrate being Si;

the substrate being $SiO_2$;

the substrate being Cu;

the substrate being Pt;

the reactor having a pressure between approximately 0.1 Pa and approximately $10^5$ Pa;

the reactor having a pressure between approximately 50 Pa and approximately 4000 Pa;

the reactor having a pressure between approximately 50 Pa and approximately 2000 Pa;

the reactor having a pressure between approximately 75 Pa and approximately 2000 Pa;

the plasma power output ranging from about 0 W to about 800 W;

the plasma power output ranging from about 50 W to about 400 W;

the plasma power output ranging from about 50 W to about 300 W;

the sequential vapor deposition process being an atomic layer deposition, a plasma enhanced atomic layer deposition, a pulsed chemical vapor deposition process, or a spatial atomic layer deposition process;

the sequential vapor deposition process being an atomic layer deposition process;

the sequential vapor deposition process being a plasma enhanced atomic layer deposition process;

the sequential vapor deposition process being a pulsed chemical vapor deposition process;

the sequential vapor deposition process being a spatial atomic layer deposition process;

the cobalt-containing layer being a cobalt film;

the cobalt film containing approximately 90 atomic % to 100 atomic % Co;

the cobalt film having a resistivity lower than 500 $\mu\Omega$ cm;

the cobalt film having a resistivity lower than 200 $\mu\Omega$ cm;

the cobalt-containing layer containing approximately 90 atomic % to 100 atomic % Co;

the cobalt-containing layer having a resistivity lower than 500 $\mu\Omega$ cm;

the cobalt-containing layer having a resistivity lower than 200 $\mu\Omega$ cm;

the cobalt-containing layer not containing a second metal or metalloid element;

the cobalt containing layer containing no Si;

the cobalt-containing layer containing no Fe;

the cobalt-containing layer containing no Ni;

annealing the cobalt-containing layer under a reducing atmosphere at a temperature between 100° C. and 500° C.;

annealing the cobalt-containing layer under a reducing atmosphere at a temperature between 250° C. and 500° C.;

the annealed cobalt-containing layer containing approximately 90 atomic to 100 atomic % Co;

the annealed cobalt-containing layer having a resistivity lower than 500 $\mu\Omega$ cm;

the annealed cobalt-containing layer having a resistivity lower than 200 $\mu\Omega$ cm;

the reducing atmosphere being $H_2$, $NH_3$, or combinations thereof;

the reducing atmosphere being $H_2$; and the reducing atmosphere being $NH_3$.

BRIEF DESCRIPTION OF DRAWINGS

For a further understanding of the nature and objects of the present invention, reference should be made to the following detailed description, taken in conjunction with the accompanying FIG, and wherein.

DETAILED DESCRIPTION OF PREFERRED EMBODIMENTS

Figure 1:
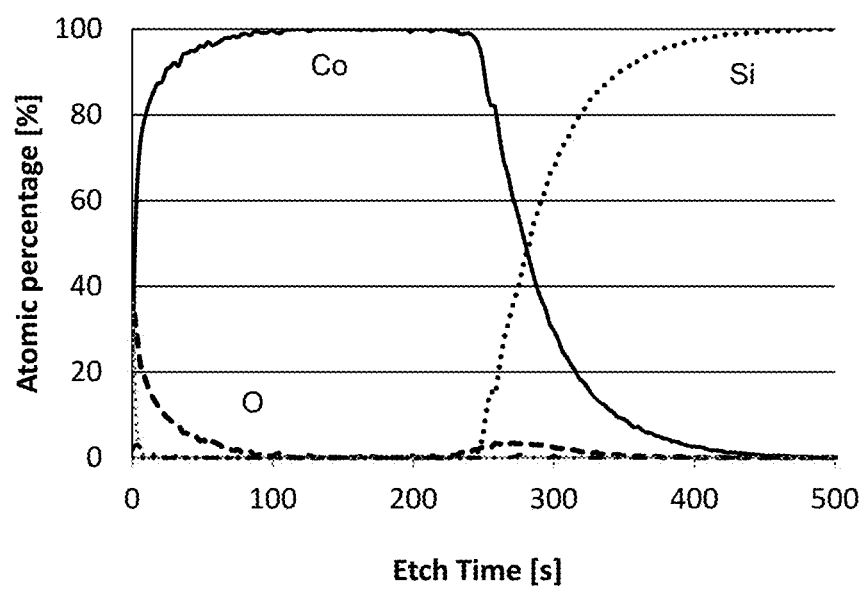
FIG. 1 is a X-ray Photoelectron Spectroscopy (XPS) graph of the Co film produced by CVD on a Si substrate.

Processes for the deposition of cobalt containing films on substrates contained in reactors are disclosed. The substrate is heated to a temperature ranging from approximately 30° C. to approximately 300° C. A nucleation layer is produced on the substrate by a first vapor deposition process having a first deposition rate below 2 nm/min by introducing a reducing gas and a vapor of $Co(CO)_3(NO)$ into the reactor. The remaining section of the cobalt-containing layer is produced on the nucleation layer by a second vapor deposition process having a second deposition rate higher than 2 nm/min by introducing a reducing gas and a vapor of $Co(CO)_3(NO)$ into the reactor. The first deposition rate increases to the second deposition rate by increasing the temperature of the substrate, by increasing the partial pressure of the vapor of $Co(CO)_3(NO)$, by increasing a pressure of the reactor, and/or by changing from a sequential first vapor deposition process to a non-sequential second vapor deposition process.

Alternatively, the cobalt-containing layer may be deposited on the substrate contained in the reactor by heating the substrate to a temperature ranging from approximately 30° C. to approximately 300° C. A nucleation layer may be produced on the substrate by a first vapor deposition process having a first deposition rate below 2 nm/min by introducing a vapor of $Co(CO)_3(NO)$ and a reducing gas into the reactor. The first deposition rate increases to a second deposition rate higher than 2 nm/min to produce a remaining section of the cobalt-containing layer on the nucleation layer by increasing the temperature of the substrate, by increasing the partial pressure of the vapor of $Co(CO)_3(NO)$, by increasing a pressure of the reactor, and/or by changing from a sequential first vapor deposition process to a non-sequential second vapor deposition process.

In another alternative, the cobalt-containing layer may be deposited on the substrate contained within the reactor by heating the substrate to a temperature ranging from approximately 30° C. to approximately 300° C. A vapor deposition process is performed in the reactor to deposit a portion of the cobalt-containing layer on the substrate by sequentially exposing the substrate to a vapor of $Co(CO)_3(NO)$ and a reducing gas at a pressure ranging from approximately 0.1 Torr to approximately 10 Torr. A chemical vapor deposition process is performed in the reactor to deposit a remaining portion of the cobalt-containing layer on the portion of the cobalt-containing layer by simultaneously introducing the reducing gas and the vapor of $Co(CO)_3(NO)$ into the reactor at a pressure ranging from approximately 3 Torr to approximately 30 Torr.

$Co(CO)_3(NO)$ is commercially available. To ensure process reliability, the $Co(CO)_3(NO)$ may be purified by continuous or fractional batch distillation prior to use to a purity ranging from approximately 95% w/w to approximately 100% w/w, preferably ranging from approximately 99% w/w to approximately 100% w/w.

The concentration of each of hexane, pentane, or alkyl-substituted pentane in the purified $Co(CO)_3(NO)$ may range from approximately 0% w/w to approximately 5% w/w, preferably from approximately 0% w/w to approximately 1% w/w. Exemplary alkyl-substituted pentanes include 2-methylpentane, 3-methylpentane, and cyclomethylpentane. Hexane may be used in the synthesis of $Co(CO)_3(NO)$. Separation of hexane from $Co(CO)_3(NO)$ may be difficult due to both having similar boiling points. However, the melting points differ. Cooling the mixture to approximately −40° C. produces solid $Co(CO)_3(NO)$ and liquid hexane. Vacuum distillation may also be used, provided the $Co(CO)_3(NO)$ to be purified is not heated above approximately 45° C.

The concentration of Ni in the purified $Co(CO)_3(NO)$ may range from approximately 0 ppm to approximately 5 ppm, and more preferably from approximately 0 ppm to approximately 1 ppm. The concentration of S in the purified $Co(CO)_3(NO)$ may range from approximately 0 ppm to approximately 5 ppm and more preferably from approximately 0 ppm to approximately 1 ppm. The concentration of P in the purified $Co(CO)_3(NO)$ may range from approximately 0 ppm to approximately 5 ppm and more preferably from approximately 0 ppm to approximately 1 ppm. The concentration of Cl in the purified $Co(CO)_3(NO)$ may range from approximately 0 ppm and approximately 5 ppm and more preferably from approximately 0 ppm to approximately 1 ppm.

The disclosed methods of forming cobalt-containing layers on substrates may be useful in the manufacture of semiconductor, photovoltaic, LCD-TFT, or flat panel type devices. The $Co(CO)_3(NO)$ precursor may deposit Co containing films using any vapor deposition methods known in the art. Examples of suitable vapor deposition methods include chemical vapor deposition (CVD) or atomic layer deposition (ALD). Exemplary CVD methods include thermal CVD, plasma enhanced CVD (PECVD), pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably a combination of two CVD processes or ALD followed by CVD in order to provide suitable step coverage and film thickness control.

The method includes introducing the vapor of $Co(CO)_3(NO)$ into a reactor having the substrate disposed therein and depositing at least part of the $Co(CO)_3(NO)$ precursor onto the substrate using the vapor deposition processes discussed above. The temperature and the pressure within the reactor and the temperature of the substrate are held at conditions suitable to deposit at least part of the $Co(CO)_3(NO)$ precursor on the surface of the substrate. A reaction gas is also be used to help in formation of the cobalt containing layer. The reaction gas may be activated by plasma.

$Co(CO)_3(NO)$ is a liquid at standard temperature and pressure. The vapor of $Co(CO)_3(NO)$ is introduced into the reactor by conventional means, such as tubing and/or flow meters. The precursor in vapor form may be produced by vaporizing the compound through a conventional vaporization step such as direct vaporization, direct liquid injection, distillation, or by bubbling. For example, the precursor may be fed in liquid state to a vaporizer where it is vaporized before it is introduced into the reactor. Alternatively, the precursor may be vaporized by passing a carrier gas into a container containing the precursor or by bubbling the carrier gas into the precursor. The carrier gas may include, but is not limited to, Ar, He, $N_2$, and mixtures thereof. Bubbling with a carrier gas may also remove any dissolved oxygen present in the precursor solution. The carrier gas and precursor are then introduced into the reactor as a vapor.

If necessary, the container of the $Co(CO)_3(NO)$ compound may be heated to a temperature that permits the compound to have a sufficient vapor pressure. The container may be maintained at temperatures in the range of, for example, approximately 0° C. to approximately 150° C. Those skilled in the art recognize that the temperature of the container may be adjusted in a known manner to control the amount of compound vaporized.

The reactor may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems. All of these exemplary reactors are capable of serving as ALD and/or CVD reactors.

Generally, the reactor contains one or more substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (SiCOH) layers, or combinations thereof. Additionally, the wafers may include copper layers, tungsten layers or noble metal layers (e.g. platinum, palladium, rhodium, or gold). The wafers may include barrier layers, such as manganese, manganese oxide, tantalum, or tantalum oxide. Plastic layers, such as poly(3,4-ethylenedioxythiophene)poly(styrenesulfonate) [PEDOT:PSS] may also be used. The layers may be planar or patterned. The disclosed processes may deposit the cobalt-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. For example, a Cu film may be deposited onto a SiC layer. In subsequent processing, a SiC layer may be deposited on the Cu layer, forming a SiC/Cu/SiC stack used in a damascene structure in the back end of the line (BEOL).

Applicants have surprisingly discovered that selective ALD or pulsed CVD deposition processes may be performed using the vapor of the $Co(CO)_3(NO)$ precursor. Selective ALD or pulsed CVD deposition may occur when the incubation time for the Co-containing film is longer on one layer than on another layer. Incubation time is defined as the time between the start of the vapor deposition process and the onset of formation of the first nuclei on the layer. Incubation time may be measured using step height measurement, gravimetrical, or microscopic methods (see, e.g., Rem et al., J. Electrochem. Soc., Vol. 144, No. 6, June 1997). The differing incubation times on different layers may be used to provide selective deposition. For example, if the incubation time on a Pt layer is longer than the incubation time on a Si layer, the deposition process may be controlled to prevent formation of the Co-containing layer on the Pt layer. More particularly, the pulsed CVD process may be performed for a period of time or number of pulses shorter than the incubation time on the Pt layer to produce the Co-containing layer on the Si layer, but not on the Pt layer. If necessary, a purge step or other reaction mechanism may be performed after the time or pulse number is reached to permit additional selective deposition (i.e., to treat the Pt layer to restart its incubation time).

Selective ALD deposition may occur when the vapor of $Co(CO)_3(NO)$ chemisorbs onto one or several of the exposed layers but does not chemisorb onto other layers. The non-chemisorbed vapor is then purged from the chamber and the reducing gas introduced to react with the chemisorbed material. As a result, the Co-containing film is formed on some, but not all, of the layers. Alternatively, selective ALD deposition may occur when the vapor of Co(CO)$_3$(NO) chemisorbs onto all of the exposed layers, but the reducing gas only reacts with some, but not all, of the chemisorbed layers. When the reducing gas does not react with the chemisorbed precursor, no film or layer is formed. The chemisorbed precursor may be purged from the chamber or remain as contaminants on the substrate.

For example, the substrate may contain Cu, Pt, Si, and SiO$_2$ layers. As shown in the following examples, it is possible to deposit a Co layer more quickly on the Si, SiO$_2$, and Cu layers using Co(CO)$_3$(NO) in a thermal ALD process at low temperatures (e.g., approximately 25° C. to approximately 110° C.), but little to no film forms on the Pt layer. The addition of plasma permits the Co layer to deposit on all 4 layers (Cu, Pt, Si, and SiO$_2$). Applicants believe that the vapor of Co(CO)$_3$(NO) chemisorbs on all four of the layers. However, the H$_2$ reducing gas alone is not reactive enough to form a film with the precursor adsorbed on the Pt metal layer. The H$_2$ reducing gas is reactive enough to form a film with the adsorbed precursor on the Si, SiO$_2$, or Cu layers. This result is surprising because many ALD precursors readily form films on metals, such as Pt, due to the strong adsorption characteristics of metals, but deposit less effectively on SiO$_2$, where a non-zero incubation time is typically observed.

The pressure within the reactor and the temperature of the substrate are held at conditions suitable for vapor deposition. In other words, after introduction of the vaporized precursor into the chamber, conditions within the chamber are such that at least part of the vaporized precursor is deposited onto the substrate to form the cobalt-containing film. For instance, the pressure in the reactor may be held between about 0.5 mTorr (0.07 Pa) and about 20 Torr (2700 Pa), more preferably between about 100 mTorr (14 Pa) and about 7.5 Torr (10$^3$ Pa). Likewise, the temperature in the reactor may be held between about room temperature (20° C.) and about 300° C. One of ordinary skill in the art will recognize that "at least part of the vaporized precursor is deposited" means that some or all of the precursor reacts with or adheres to the substrate.

The substrate may be heated by either controlling the temperature of the substrate holder (in a cold wall reactor) or controlling the temperature of the reactor wall (in a hot wall reactor) or a combination of both methods. Devices used to heat the substrate are known in the art.

The reactor wall may be heated to a sufficient temperature to obtain the desired film at a sufficient growth rate and with desired physical state and composition. A non-limiting exemplary temperature range to which the reactor wall may be heated includes from approximately 20° C. to approximately 350° C. When a plasma deposition process is utilized, the deposition temperature may range from approximately 20° C. to approximately 100° C. Alternatively, when a thermal process is performed, the deposition temperature may range from approximately 150° C. to approximately 300° C.

Alternatively, the substrate may be heated to a sufficient temperature to obtain the desired cobalt-containing layer at a sufficient growth rate and with desired physical state and composition. A non-limiting exemplary temperature range to which the substrate may be heated includes from 30° C. to 300° C. Preferably, the temperature of the substrate ranges from approximately 90° C. to 250° C. in the disclosed two step process. Alternatively, for selective deposition, the temperature of the substrate ranges from approximately 50° C. to approximately 110° C.

In addition to the disclosed precursor, a reactant may also be introduced into the reactor. The reactant may be an oxidizing gas such as one of O$_2$, O$_3$, H$_2$O, H$_2$O$_2$, NO, N$_2$O, NO$_2$, oxygen containing radicals such as O$^-$ or OH$^-$, NO, NO$_2$, carboxylic acids, formic acid, acetic acid, propionic acid, and mixtures thereof. Typically, the oxidizing gas is selected from the group consisting of O$_2$, O$_3$, H$_2$O, H$_2$O$_2$, oxygen containing radicals thereof such as O$^-$ or OH$^-$, and mixtures thereof. More typically, the oxidizing gas is O$_2$, O$_3$, O$_2$ plasma, or combinations thereof.

Alternatively, the reactant may be a reducing gas such as one of H$_2$, H$_2$CO, NH$_3$, SiH$_4$, Si$_2$H$_6$, Si$_3$H$_8$, Me$_2$SiH$_2$, Et$_2$SiH$_2$, MeSiH$_3$, EtSiH$_3$, phenyl silane, N$_2$H$_4$, N(SiH$_3$)$_3$, NMeH$_2$, NEtH$_2$, NMe$_2$H, NEtH, NMe$_3$, NEt$_3$, (SiMe$_3$)$_2$NH, MeHNNH$_2$, Me$_2$NNH$_2$, phenyl hydrazine, N-containing molecules, B$_2$H$_6$, 9-borabicyclo[3,3,1]nonane, dihydrobenzenfuran, pyrazoline, trimethylaluminium, dimethylzinc, diethylzinc, radical species thereof, and mixtures thereof. Preferably, the reducing as is H$_2$, NH$_3$, SiH$_4$, Si$_2$H$_6$, Si$_3$H$_8$, SiH$_2$Me$_2$, SiH$_2$Et$_2$, N(SiH$_3$)$_3$, hydrogen radicals thereof, or mixtures thereof. Preferably, the reducing gas is H$_2$ or NH$_3$.

In another alternative, the reactant may be a nitrogen-containing reactant such as one of NH$_3$, N$_2$H$_4$, N(SiH$_3$)$_3$, N(CH$_3$)H$_2$, N(C$_2$H$_5$)H$_2$, N(CH$_3$)$_2$H, N(C$_2$H$_5$)$_2$H, N(CH$_3$)$_3$, N(C$_2$H$_5$)$_3$, (SiMe$_3$)$_2$NH, (CH$_3$)HNNH$_2$, (CH$_3$)$_2$NNH$_2$, nitrogen-containing radical species thereof, and mixtures thereof.

In another alternative the reactant is hydrogen and the Co(CO)$_3$NO:H$_2$ ratio ranges from approximately 0.001 to approximately 0.005.

The reaction gas may be treated by plasma in order to decompose the reaction gas into its radical form. The plasma may be generated or present within the reaction chamber itself. Alternatively, the plasma may generally be at a location removed from the reaction chamber, for instance, in a remotely located plasma system. One of skill in the art will recognize methods and apparatus suitable for such plasma treatment.

For example, the reaction gas may be introduced into a direct plasma reactor, which generates plasma in the reaction chamber, to produce the plasma-treated reaction gas in the reaction chamber. Exemplary direct plasma reactors include the Titan™ PECVD System produced by Trion Technologies. The reaction gas may be introduced and held in the reaction chamber prior to plasma processing. Alternatively, the plasma processing may occur simultaneously with the introduction of the reaction gas. In-situ plasma is typically a 13.56 MHz RF capacitively coupled plasma that is generated between the showerhead and the substrate holder. The substrate or the showerhead may be the powered electrode depending on whether positive ion impact occurs. Typical applied powers in in-situ plasma generators are from approximately 50 W to approximately 1000 W. The disassociation of the reaction gas using in-situ plasma is typically less than achieved using a remote plasma source for the same power input and is therefore not as efficient in reaction gas disassociation as a remote plasma system, which may be beneficial for the deposition of metal-nitride-containing films on substrates easily damaged by plasma.

Alternatively, the plasma-treated reaction gas may be produced outside of the reaction chamber. The MKS Instruments' ASTRONi® reactive gas generator may be used to treat the reaction gas prior to passage into the reaction chamber. Operated at 2.45 GHz, 7 kW plasma power, and a pressure ranging from approximately 3 Torr to approximately 10 Torr, the reaction gas O$_2$ may be decomposed into two O$^-$ radicals. Preferably, the remote plasma may be generated with a power ranging from about 1 kW to about 10 kW, more preferably from about 2.5 kW to about 7.5 kW.

Applicants have discovered that pure Co films may be deposited using a two step vapor deposition process at lower temperatures than reported in the prior art (cf., A. R. Ivanova et al, J. Electrochem. Soc, 146 (6) 2139-2145, 1999; A. R. Ivanova et al, J. Electrochem. Soc., 148(1) C21-C27, 2001; Deo et al., Proceedings—Electrochemical Society (2003), 2003-8 (Chemical Vapor Deposition XVI and EUROCVD 14, Volume 2), 1008-1015).

Prior to the process, the substrate is heated to a temperature ranging from approximately 30° C. to approximately 300° C. In the first step, a portion of the Co film, also referred to as a nucleation layer, is deposited. The deposition rate in the first step is slow, preferably between approximately 0.1 nm/min and approximately 2 nm/min (i.e., 0.1 nm/min≤deposition rate<2 nm/min). Any of the deposition processes cited above may be performed in the first step. In one alternative, the deposition process of the first step is a sequential process, where the precursor introduction precedes or follows the reactant introduction, but the precursor and reactant are not introduced into the reactor at the same time. Exemplary sequential processes include atomic layer deposition, plasma enhanced atomic layer deposition, pulsed chemical vapor deposition, or spatial atomic layer deposition. CVD is typically a non-sequential process because the precursor and reactant are typically simultaneously introduced into the reactor.

The slow deposition rate produces a Co layer having a small grain size. For example, the grains in the nucleation layer may have a mean diameter ranging from approximately 20 to approximately 60 nm, as visually measured using a scanning electron microscope. Applicants believe that the small grain size deposited during the first step of the process acts as a nucleation layer which minimizes formation of larger grain sizes when the deposition rate is increased in the second step. One of ordinary skill in the art will recognize that nucleation is the process in which ions, atoms, or molecules arrange themselves in a pattern characteristic of a crystalline solid, forming a site on which additional particles deposit as the crystal grows. As result, the additional particles adopt the crystalline structure of the underlying nucleation layer.

Initial testing helped to determine when to switch from the first step to the second step. A 10-20 nm film was deposited in the first step, which coincided to approximately 5-10 ALD cycles and 10 minutes of CVD. One of ordinary skill in the art will recognize that thinner or thicker nucleation layers may be deposited and that the corresponding number of cycles/time may vary depending upon the reactor used for the process.

The deposition rate in the first step is increased in the second step, preferably to a rate between approximately 2 nm/min and approximately 10 nm/min (i.e., 2 nm/min≤deposition rate≤10 nm/min), to deposit the remaining portion of the cobalt film. The deposition rate may be increased by increasing the temperature of the substrate and/or reactor walls, increasing the pressure of the reactor, increasing the partial pressure of the vapor of $Co(CO)_3(NO)$, and/or by changing from a sequential vapor deposition process, such as ALD or pulsed CVD, to a non-sequential vapor deposition process, such as CVD.

In one alternative, a CVD deposition process may be performed in the first and second steps. The reactor is maintained at a temperature ranging from approximately 20° C. to approximately 300° C. and a pressure ranging from approximately 5 Torr (670 Pa) to approximately 10 Torr (1300 Pa). The deposition rate is increased by increasing the ratio of the flow rates of the vapor of $Co(CO)_3(NO)$ to the reducing gas. More particularly, the ratio of the flow rate of the vapor of $Co(CO)_3(NO)$ to the reducing gas may range from 0.001 to less than 0.003 in the first step (e.g, 1<3 sccm $Co(CO)_3(NO)$: 1000 sccm $H_2$). The ratio of the flow rate of the vapor of $Co(CO)_3(NO)$ and the reducing gas may increase to a range from 0.003 to 0.005 in the second step (e.g., 3-5 sccm $Co(CO)_3(NO)$: 1000 sccm $H_2$).

In another alternative, an ALD process may be performed in the first step and a CVD process performed in the second step. During the ALD first step, the reactor is maintained at a temperature ranging from approximately 20° C. to approximately 150° C. and a pressure ranging from approximately 0.1 Torr (13 Pa) to approximately 3 Torr (400 Pa). The ALD process may include plasma during the reducing gas pulse ranging from 50 W to approximately 300 W. During the CVD step, the reactor is maintained at a temperature ranging from approximately 20° C. to approximately 300° C. and a pressure ranging from approximately 5 Torr (670 Pa) to approximately 10 Torr (1300 Pa).

The two step process may be continuous, with no down time between the two steps. In other words, the change from step one to step two occurs without stopping the process. For example, the reducing gas and the vapor of $Co(CO)_3(NO)$ may be introduced into the reactor with the reactor and/or substrate set at one temperature and/or pressure to deposit a portion of the Co film, or nucleation layer, and then the temperature and/or pressure increased while the reducing gas and the vapor of $Co(CO)_3(NO)$ continue to be introduced into the reactor for the second step having a faster deposition rate.

Alternatively, the two step process may include additional process steps therebetween. For example, the first process step may be an ALD process in one reactor and the second process step may be a CVD process in a separate reactor, with the additional process steps including transfer of the substrate from the first reactor to the second reactor. An annealing step may also be included between the first step and the second step.

The resulting cobalt film has a bulk resistivity of from approximately 6 microOhm/cm to approximately 200 microOhm·cm and a Co atomic composition greater than 95 atomic % (i.e., 95≤100 atomic %).

The disclosed methods also may be used to form a two element-containing layer on a substrate using a vapor deposition process and, more particularly, for deposition of CoSi and CoW layers, wherein M is the second element and is selected from the group consisting of group 2, group 13, group 14, transition metal, lanthanides, and combinations thereof, and more preferably from Mg, Ca, Sr, Ba, Hf, Nb, Ta, Al, Si, Ge, Y, or lanthanides. The method includes: introducing cobalt precursor disclosed above into a reactor having at least one substrate disposed therein, introducing a second precursor into the reactor, and depositing at least part of the cobalt precursor and at least part of the second precursor onto the at least one substrate to form the two element-containing layer using a vapor deposition process. Other method maybe forming of cobalt film onto substrate which contains second elements disclosed above and heated at between 200° C. to 1000° C. under inert gases, reducing gases or vacuum such as silicidation When the desired cobalt layer also contains another element, such as, for example and without limitation, Mg, Ca, Sr, Ba, Hf, Nb, Ta, Al, Si, Ge, Y, or lanthanides (such as Er), or combinations thereof, the reaction gas may include a second precursor which is selected from, but not limited to, metal alkyls, such as $(Me)_3Al$, metal amines, such as $Nb(Cp)(NtBu)(NMe_2)_3$, and any combination thereof.

The cobalt precursor and one or more reaction gases may be introduced into the reactor simultaneously (chemical vapor deposition), sequentially (atomic layer deposition), or in other combinations. For example, the cobalt precursor may be introduced in one pulse and two additional precursors may be introduced together in a separate pulse [modified atomic layer deposition]. Alternatively, the reactor may already contain the reaction gas prior to introduction of the cobalt precursor. Alternatively, the cobalt precursor may be introduced to the reactor continuously while other reaction gases are introduced by pulse (pulsed-chemical vapor deposition). The reaction gas may be passed through a plasma system localized or remotely from the reactor, and decomposed to radicals. In each example, a pulse may be followed by a purge or evacuation step to remove excess amounts of the component introduced. In each example, the pulse may last for a time period ranging from about 0.01 s to about 30 s, alternatively from about 0.3 s to about 3 s, alternatively from about 0.5 s to about 2 s. In another alternative, the cobalt precursor and one or more reaction gases may be simultaneously sprayed from a shower head under which a susceptor holding several wafers is spun (spatial ALD).

In one non-limiting exemplary atomic layer deposition type process, the vapor phase of a cobalt-containing compound is introduced into the reactor, where it is contacted with a suitable substrate. Excess cobalt precursor may then be removed from the reactor by purging and/or evacuating the reactor. A reducing reagent is introduced into the reactor where it reacts with the absorbed cobalt precursor in a self-limiting manner. Any excess reducing reagent is removed from the reactor by purging and/or evacuating the reactor. If the desired layer is a cobalt layer, this two-step process may provide the desired layer thickness or may be repeated until a layer having the necessary thickness has been obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the cobalt film may be exposed to a temperature ranging from approximately 200° C. to approximately 1000° C. for a time ranging from approximately 0.1 second to approximately 7200 seconds under an inert atmosphere, a H-containing atmosphere, a N-containing atmosphere, or combinations thereof. Most preferably, the temperature is 400° C. for 3600 seconds under a H-containing atmosphere. The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, is expected to effectively reduce any carbon and nitrogen contamination of the alkali metal-containing film. This in turn is expected to improve the resistivity of the film.

EXAMPLES

The following non-limiting examples are provided to further illustrate embodiments of the invention. However, the examples are not intended to be all inclusive and are not intended to limit the scope of the inventions described herein.

In the following examples, the cobalt film was deposited using a CN1 Atomic Premium vapor deposition apparatus. The $Co(CO)_3(NO)$ canister was heated to 30° C. to produce the vapor. A bubbler and inert gas were not necessary to introduce the vapor of $Co(CO)_3(NO)$ into the reactor. However, a separate 100 sccm flow of Ar was used in the following examples to provide a continuous gas flow to the reactor in order to prevent backflow of the $H_2$ reactant. The flow of the vapor of $Co(CO)_3(NO)$ into the vapor deposition apparatus was controlled by a mass flow controller (for Ar, conversion factor 0.18). The actual deposition temperature and substrate temperature was estimated based on pressure-temperature relation expressions obtained in advance. The silicon wafer was soaked in a 1% HF solution for 1 minute and rinsed with pure water to remove the oxide layer before use.

Comparative Example 1

CVD Deposition of Co Film

A Co film was deposited on a Si substrate. The substrate temperature was estimated to be about 235° C. The pressure in the reactor was 9.3 Torr. The vapor of $Co(CO)_3(NO)$ was introduced into the reactor at a 5 sccm flow rate. Hydrogen ($H_2$) was simultaneously introduced into the reactor at a 1000 sccm flow rate. The partial pressure of $H_2$ was 7.88. FIG. 1 is a X-ray Photoelectron Spectroscopy (XPS) graph of the resulting Co film. The graph illustrates that a pure Co film was deposited by CVD at low temperatures, contrary to the teachings of A. R. Ivanova et al. and Deo et al. referenced in the Background, by using a higher reactor pressure. The deposition rate was 2.92 nm/min.

Comparative Example 2

PEALD Deposition of Co Film

Figure 2:
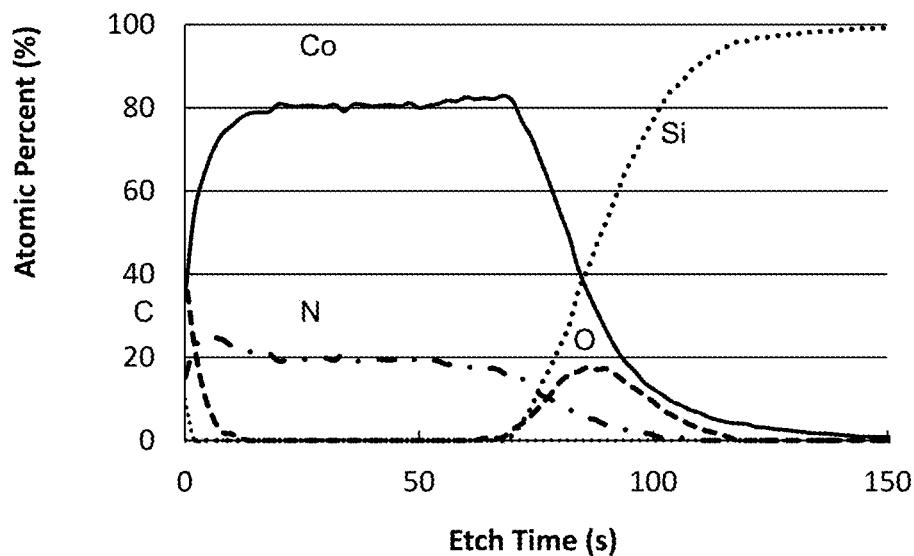
FIG. 2 is a XPS graph of the Co film produced by PEALD on a Si substrate.

An ALD process was performed to try to deposit a Co film on a Si substrate. The substrate temperature was estimated to be about 85° C. The pressure in the reactor was 0.5 Torr. The plasma wattage was 100. The vapor of $Co(CO)_3(NO)$ was introduced into the reactor at a 2.5 sccm flow rate and purged. Hydrogen ($H_2$) was introduced into the reactor at a 100 sccm flow rate and purged. The ALD sequence was 5 second $H_2$ plasma introduction, 21 second Ar purge, 6.5 second $Co(CO)_3(NO)$ introduction, 21 second Ar purge. 100 cycles were repeated and the growth rate was approximately 0.16 nm/cycle. FIG. 2 is a X-ray Photoelectron Spectroscopy (XPS) graph of the resulting Co film. The graph illustrates that a CoN film was deposited.

Figure 3:
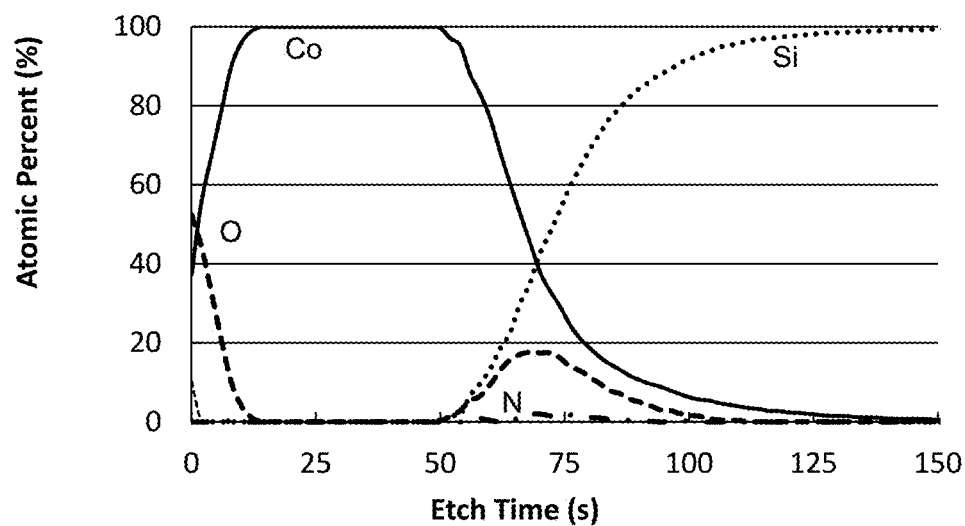
FIG. 3 is a XPS graph of the Co film of FIG. 2 after annealing.

The film produced was subject to annealing under $H_2$ at 253° C. ($H_2$ flow rate of 100 sccm and 1 Torr pressure for 60 minutes). FIG. 3 is a X-ray Photoelectron Spectroscopy (XPS) graph of the annealed Co film. The graph illustrates that annealing converted the CoN film to a pure Co film.

Comparative Example 3

ALD Deposition of Co Film

Figure 4:
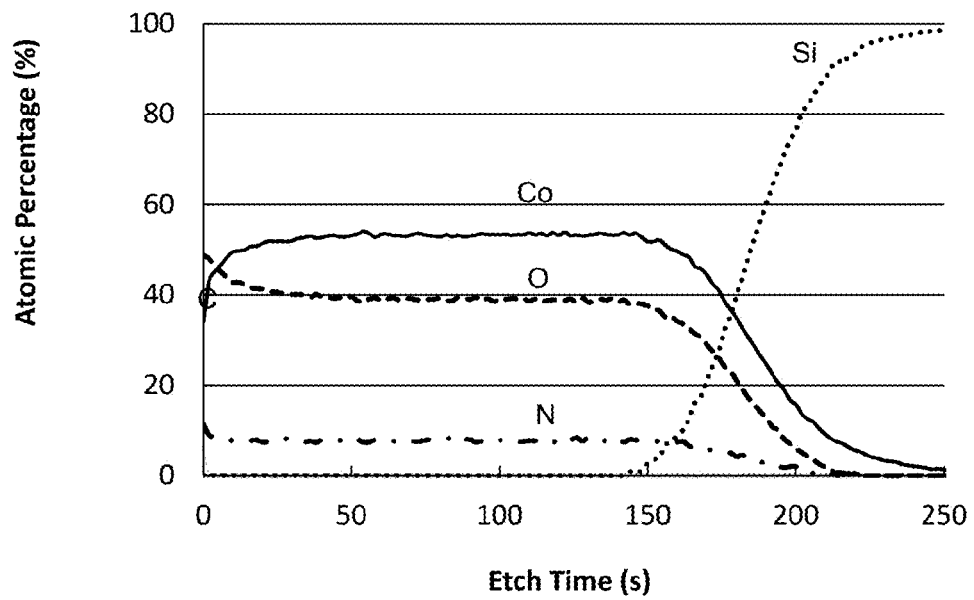
FIG. 4 is a XPS graph of the Co film produced by ALD on a Si substrate.

An ALD process was performed to try to deposit a Co film on a Si substrate. The substrate temperature was estimated to be about 109° C. The pressure in the reactor was 0.8 Torr. The vapor of $Co(CO)_3(NO)$ was introduced into the reactor at a 2.5 sccm flow rate and purged with an inert gas. Hydrogen ($H_2$) was introduced into the reactor at a 500 sccm flow rate and purged with an inert gas. The ALD sequence was 5 second $H_2$ plasma introduction, 16 second Ar purge, 6.5 second $Co(CO)_3(NO)$ introduction, 12 second Ar purge. 100 cycles were repeated and the growth rate was approximately 0.44 nm/cycle. FIG. 4 is a X-ray Photoelectron Spectroscopy (XPS) graph of the resulting Co film. The graph illustrates that a CoON film was deposited.

Figure 5:
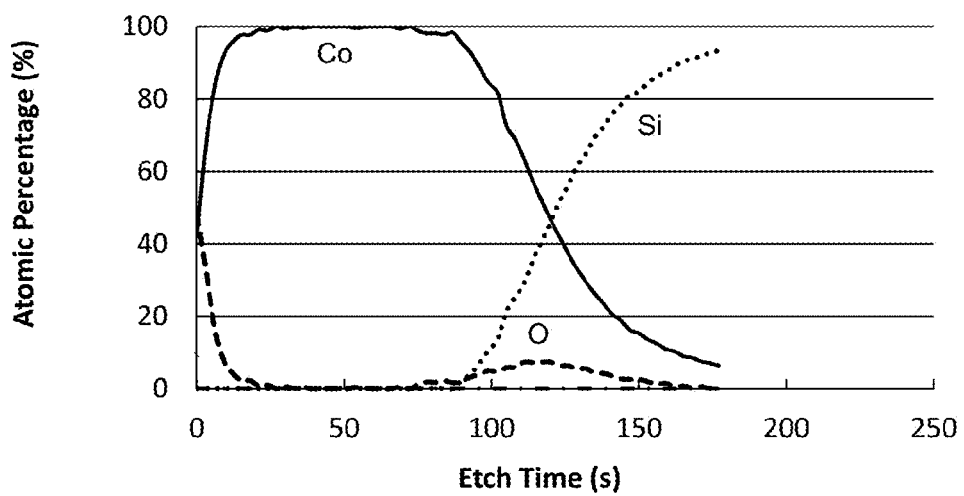
FIG. 5 is a XPS graph of the Co film of FIG. 4 after annealing.

The film produced was subject to annealing under $H_2$ at 285° C. ($H_2$ flow rate of 100 sccm and 1 Torr pressure for 60 minutes). FIG. 5 is a X-ray Photoelectron Spectroscopy (XPS) graph of the annealed Co film. The graph illustrates that annealing converted the CoON film to a pure Co film.

Example 1

CVD Deposition of Co Film with Varied Flow Ratio

Three separate Co films were deposited on $SiO_2$ substrates. The substrate temperature was estimated to be about 253° C. The pressure in the reactor was 9.3 Torr. The first Co film was deposited using a 2.5 sccm flow rate of the vapor of $Co(CO)_3(NO)$ and the growth rate was approximately 1.78 nm/min. The second Co film was deposited using a 5 sccm flow rate of the vapor of $Co(CO)_3(NO)$ and the growth rate was approximately 3.3 nm/min. The third Co film was deposited using a 2.5 sccm flow rate of the vapor of $Co(CO)_3(NO)$ and the growth rate was approximately 1.78 nm/min, followed by a 5 sccm flow rate and the growth rate was approximately 3.3 nm/min. Hydrogen ($H_2$) was simultaneously introduced into the reactor at a 1000 sccm flow rate.

Figure 6:
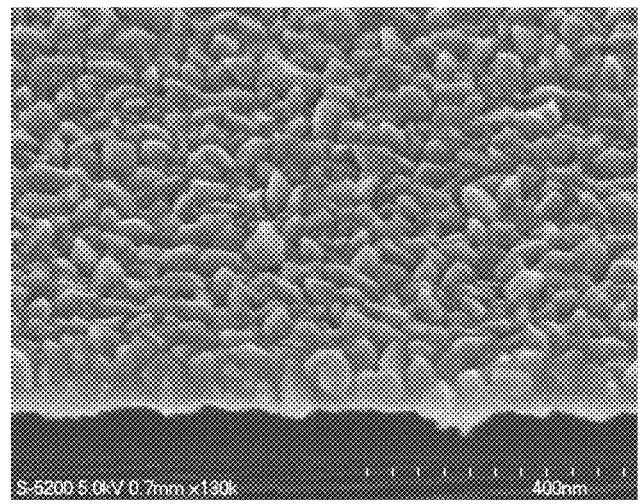
FIG. 6 is a scanning electron microscope (SEM) photograph of a film deposited on a $SiO_2$ substrate using CVD and a 2.5 sccm flow rate.
Figure 7:
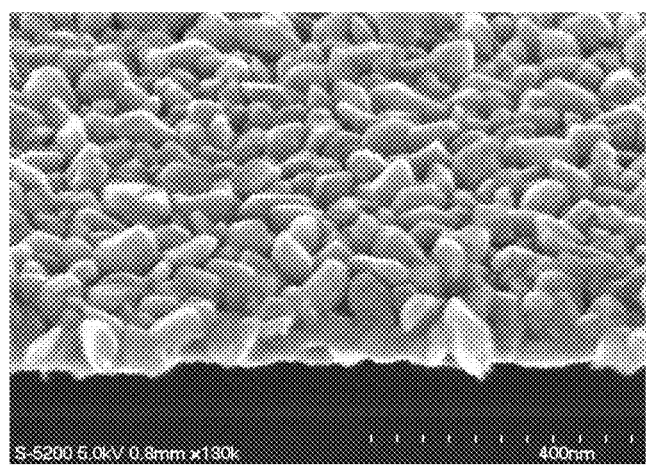
FIG. 7 is a SEM photograph of a film deposited on a $SiO_2$ substrate using CVD and a 5 sccm flow rate.
Figure 8:
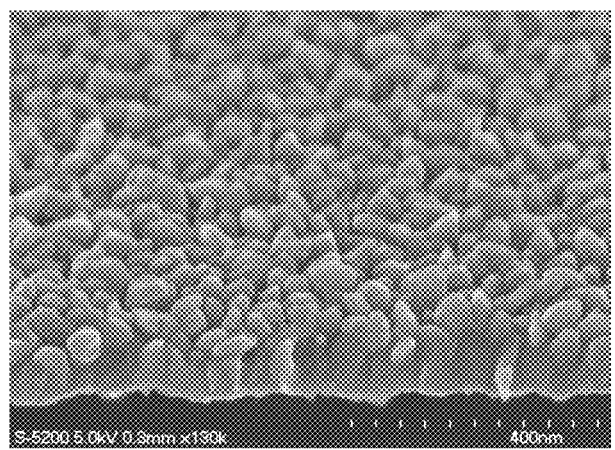
FIG. 8 is a SEM photograph of a film deposited on a $SiO_2$ substrate using CVD and a combination 2.5 sccm/5 sccm flow rate.

FIG. 6 is a scanning electron microscope photograph of the film deposited using the 2.5 sccm flow rate. FIG. 7 is a scanning electron microscope photograph of the film deposited using the 5 sccm flow rate. FIG. 8 is a scanning electron microscope photograph of the film deposited using the combination 2.5 sccm/5 sccm flow rate. As can be seen, the grain size in FIG. 8 is smaller (approx 40-60 nm) than that of FIGS. 6 and 7 (approx. 60-80 nm).

Figure 9:
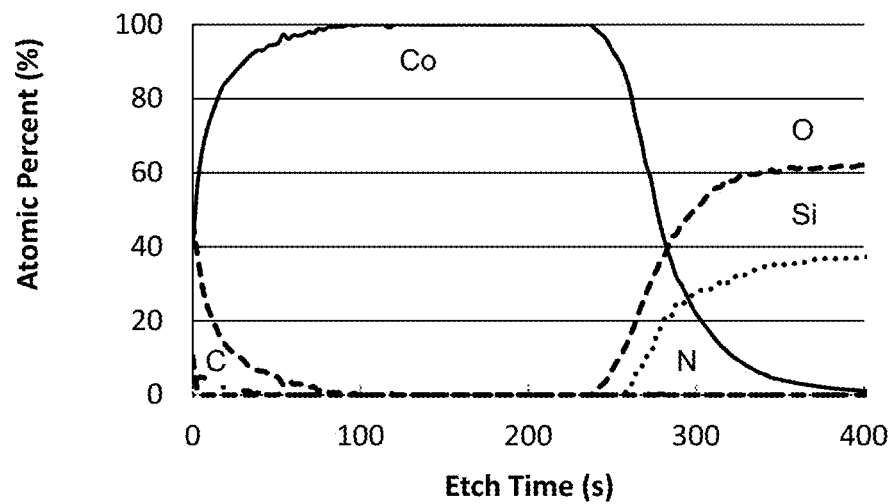
FIG. 9 is a XPS graph of the Co film produced on a $SiO_2$ substrate using CVD and a 2.5 sccm flow rate.
Figure 10:
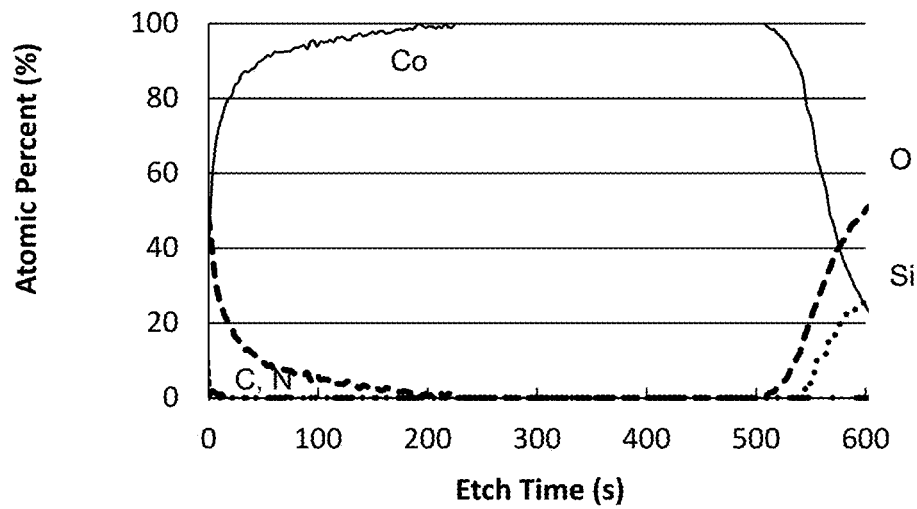
FIG. 10 is a XPS graph of the Co film produced on a $SiO_2$ substrate using CVD and a 5 sccm flow rate.
Figure 11:
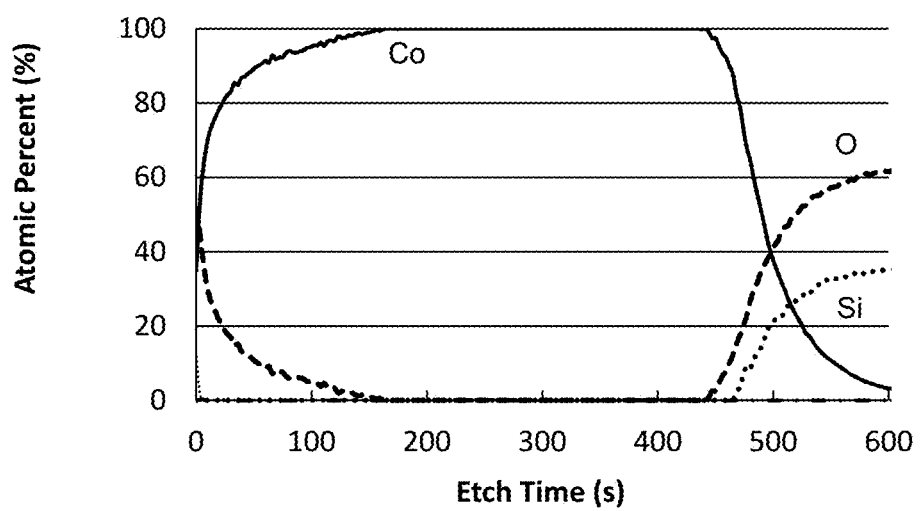
FIG. 11 is a XPS graph of the Co film produced on a $SiO_2$ substrate using CVD and a combination 2.5 sccm/5 sccm flow rate.

FIG. 9 is a X-ray Photoelectron Spectroscopy (XPS) graph of the Co film produced using the 2.5 sccm flow rate alone. FIG. 10 is a X-ray Photoelectron Spectroscopy (XPS) graph of the Co film produced using the 5 sccm flow rate alone. FIG. 11 is a XPS graph of the Co film produced by the combination 2.5 sccm/5 sccm flow rate. The graph illustrates that the CVD methods produce a pure Co film.

Example 2

Deposition of Co Film with ALD/CVD Combination

A Co film was deposited on a Si substrate using an ALD deposition process followed by a CVD deposition process. The substrate temperature was estimated to be about 109° C. during the ALD deposition process. The pressure in the reactor was 0.8 Torr during the ALD deposition process. The vapor of $Co(CO)_3(NO)$ was introduced into the reactor at a 2.5 sccm flow rate and purged with an inert gas. Hydrogen ($H_2$) was introduced into the reactor at a 100 sccm flow rate and purged with an inert gas. The ALD sequence was 5 second $H_2$ introduction, 21 second Ar purge, 6.5 second $Co(CO)_3(NO)$ introduction, 21 second Ar purge. 10 cycles were repeated and the growth rate was approximately 0.44 nm/cycle.

The substrate temperature was raised to 235° C. and pressure was raised to 7.2 Torr. The vapor of $Co(CO)_3(NO)$ was introduced into the reactor at a 2.5 sccm flow rate. Hydrogen ($H_2$) was simultaneously introduced into the reactor at a 500 sccm flow rate. The CVD process was performed for 10 minutes and the growth rate was approximately 2.92 nm/min.

Figure 12:
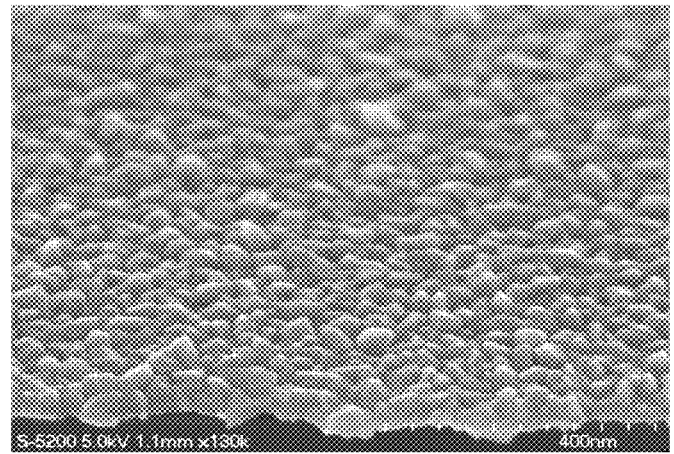
FIG. 12 is a SEM photograph of a Co film deposited on a Si substrate using an ALD/CVD combination deposition process.
Figure 13:
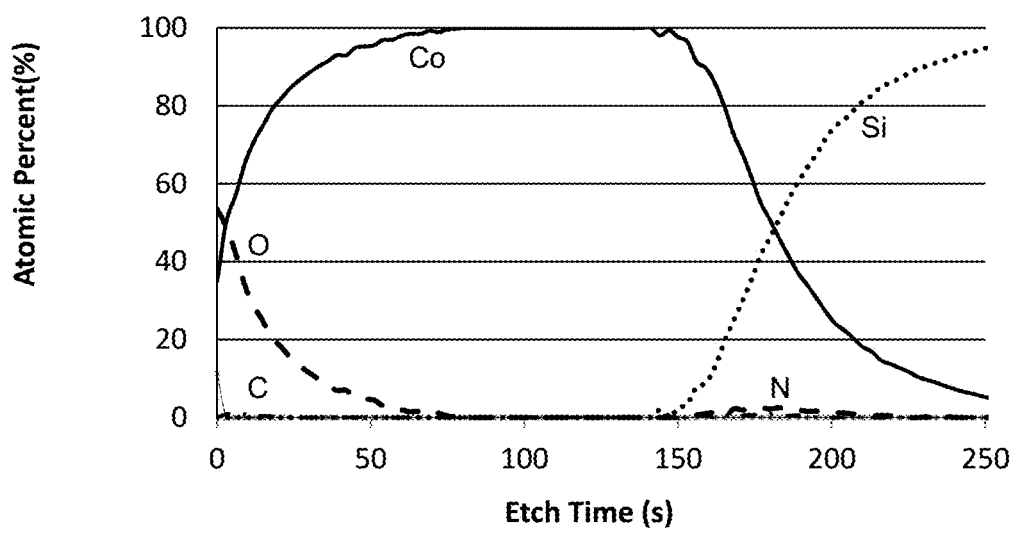
FIG. 13 is a XPS graph of the Co film deposited on a Si substrate using an ALD/CVD combination deposition process.

FIG. 12 is a scanning electron microscope photograph of the film deposited using the ALD/CVD combination deposition process. As can be seen, the grain size in FIG. 12 is smaller (approx 20-40 nm) than any of those of FIGS. 6-8 in Example 1. FIG. 13 is a X-ray Photoelectron Spectroscopy (XPS) graph of the resulting Co film. The graph of FIG. 13 illustrates that the combined ALD/CVD method produced a pure Co film.

Example 3

Deposition of Co Film with PEALD/CVD Combination

A Co film was deposited on a Si substrate using a PEALD deposition process followed by a CVD deposition process. The substrate temperature was estimated to be about 85° C. during the PEALD deposition process. The pressure in the reactor was 0.5 Torr during the ALD deposition process. The vapor of $Co(CO)_3(NO)$ was introduced into the reactor at a 2.5 sccm flow rate and purged with an inert gas. Hydrogen ($H_2$) was introduced into the reactor at a 100 sccm flow rate and purged with an inert gas. The ALD sequence was 5 second $H_2$ introduction, 21 second Ar purge, 6.5 second $Co(CO)_3(NO)$ introduction, 21 second Ar purge. 5 cycles were repeated and the growth rate was approximately 0.13 nm/cycle.

The substrate temperature was raised to 235° C. and pressure was raised to 8.9 Torr. The vapor of $Co(CO)_3(NO)$ was introduced into the reactor at a 2.5 sccm flow rate. Hydrogen ($H_2$) was simultaneously introduced into the reactor at a 500 sccm flow rate. Ar was introduce into the reactor at a 100 sccm flow rate. The CVD process was performed for 10 minutes and the growth rate was approximately 2.92 nm/min.

Figure 14:
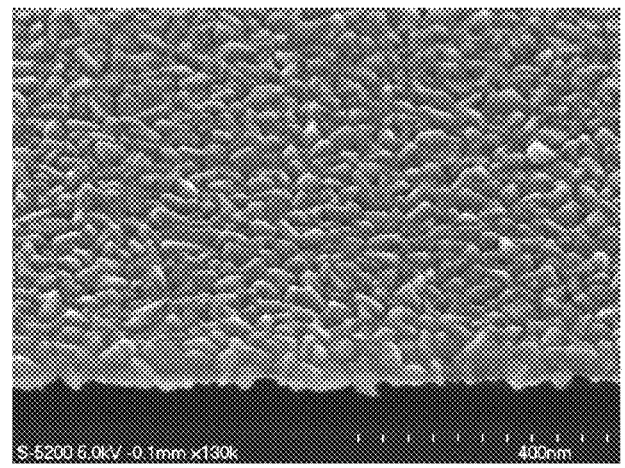
FIG. 14 is a SEM photograph of a Co film deposited on a Si substrate using a PEALD/CVD combination deposition process.
Figure 15:
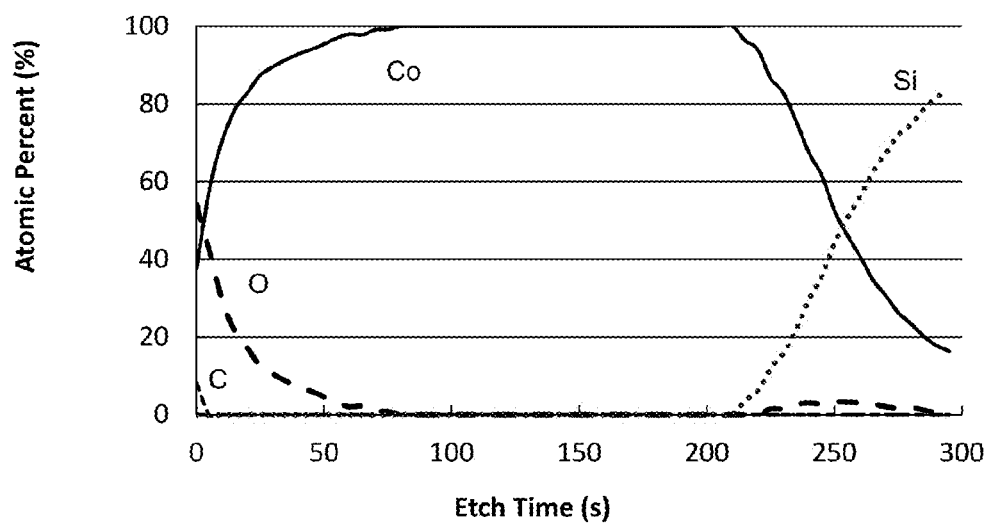
FIG. 15 is a XPS graph of a Co film deposited on a Si substrate using a PEALD/CVD combination deposition process.

FIG. 14 is a scanning electron microscope photograph of the film deposited using the ALD/CVD combination deposition process. As can be seen, the grain size in FIG. 14 is smaller (approx 20-40 nm) than any of those of FIGS. 6-8 in Example 1 FIG. 15 is a X-ray Photoelectron Spectroscopy (XPS) graph of the resulting Co film. The graph of FIG. 15 illustrates that the combined ALD/CVD method produced a pure Co film.

Example 4

Selective Deposition of Co Films

Testing of Co-containing film deposition was performed on four different substrates: Si, $SiO_2$, Cu, and Pt using an ALD deposition process. The substrate temperature was estimated to be about 126° C. during the ALD deposition process. The pressure in the reactor was 0.8 Torr during the ALD deposition process. The vapor of $Co(CO)_3(NO)$ was introduced into the reactor at a 2.5 sccm flow rate and purged with an inert gas. Hydrogen ($H_2$) was introduced into the reactor at a 100 sccm flow rate and purged with an inert gas. The ALD sequence was 5 second $H_2$ introduction, 21 second Ar purge, 6.5 second $Co(CO)_3(NO)$ introduction, 21 second Ar purge. On Si, a Co film was deposited with oxygen at approximately 40% and nitrogen at approximately 7~8%. 100 cycles were repeated the growth rate was approximately 1.01 nm/cycle. On $SiO_2$, a Co film was deposited with oxygen at approximately 40% and nitrogen at approximately 7~8%. 100 cycles were repeated the growth rate was approximately 1.13 nm/cycle. On Cu, a Co film was deposited with oxygen at approximately 40% and nitrogen at approximately 8%. 100 cycles were repeated the growth rate was approximately 1.36 nm/cycle. On Pt, a Co film was deposited. 100 cycles were repeated and the growth rate was approximately 0.24 nm/cycle.

In a separate experiment, the process above was repeated, except that the $H_2$ flow rate was 500 sccm. The film thicknesses were measured after 100 cycles and after 200 cycles. The thickness of material deposited after 200 cycles decreased as compared to the thickness deposited during the first 100 cycles, indicating that all four substrates exhibit an incubation delay. More particularly, a layer 44.1 nm thick deposited on Si after 100 cycles and 66.1 nm thick after 200 cycles. A layer 33.1 nm thick deposited on $SiO_2$ after 100 cycles and 52.9 nm thick after 200 cycles. A layer less than 12.4 nm thick deposited on Cu after 100 cycles and 30.9 nm thick after 200 cycles. Very little Co was observed on the Pt surface after both 100 and 200 cycles.

Figure 16:
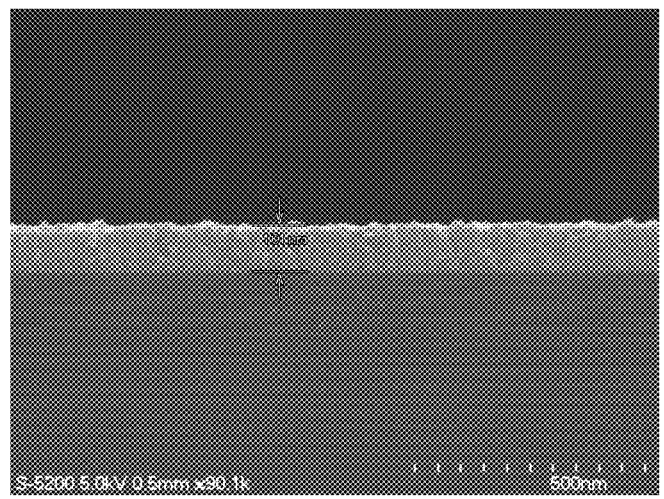
FIG. 16 is a SEM photograph of a Co film deposited on a Si substrate using an ALD deposition process.
Figure 17:
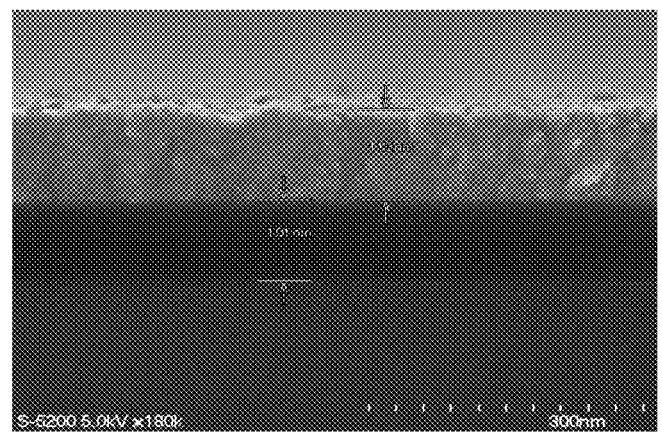
FIG. 17 is a SEM photograph of a Co film deposited on a $SiO_2$ substrate using an ALD deposition process.
Figure 18:
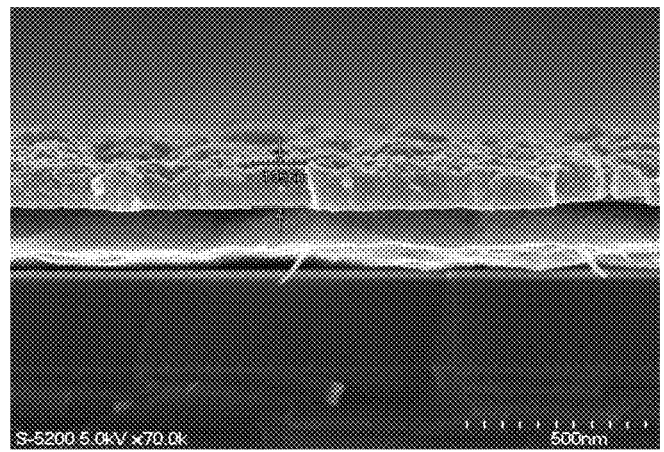
FIG. 18 is a SEM photograph of a Co film deposited on a Cu substrate using an ALD deposition process.
Figure 19:
FIG. 19 is a SEM photograph of a Co film deposited on a Pt substrate using an ALD deposition process.
Figure 20:
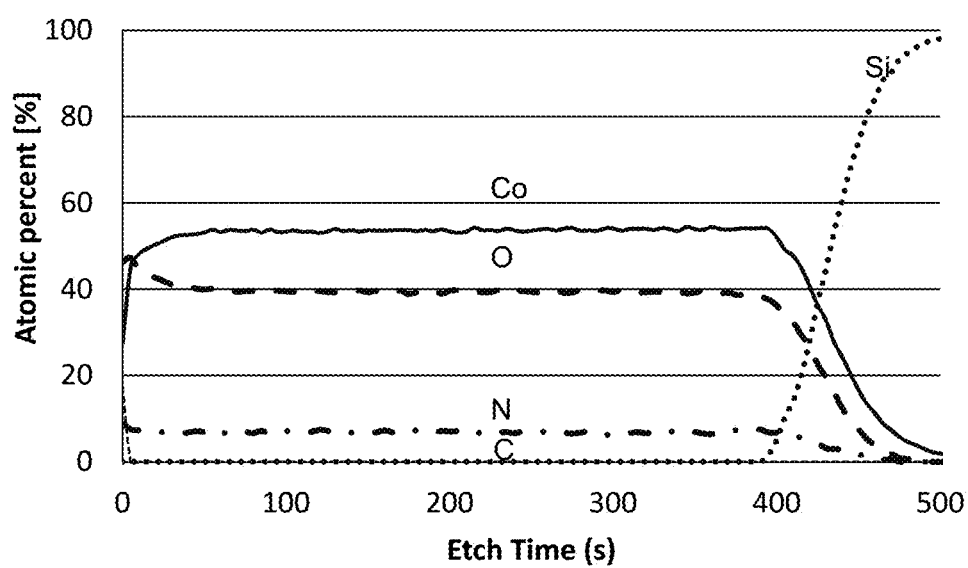
FIG. 20 is a XPS graph of a Co film deposited on a Si substrate using an ALD deposition process.
Figure 21:
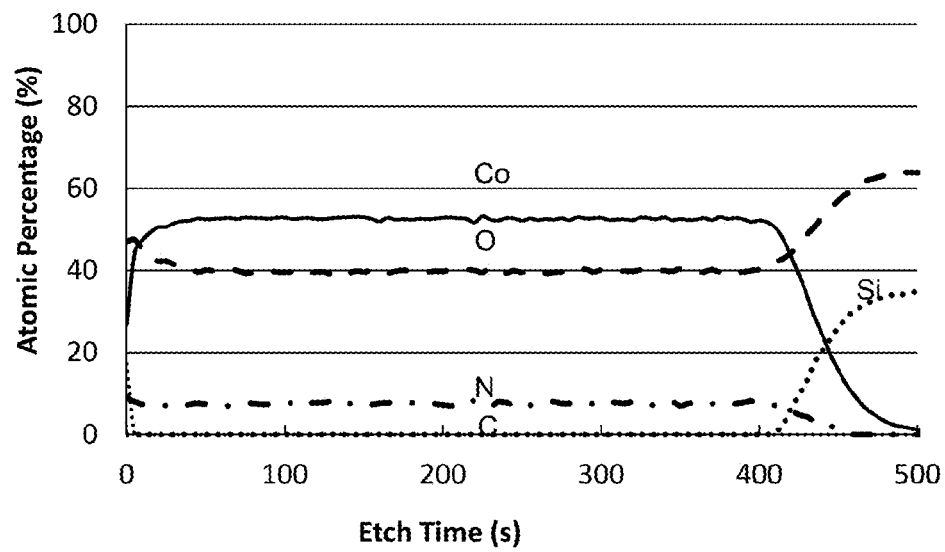
FIG. 21 is a XPS graph of a Co film deposited on a $SiO_2$ substrate using an ALD deposition process.
Figure 22:
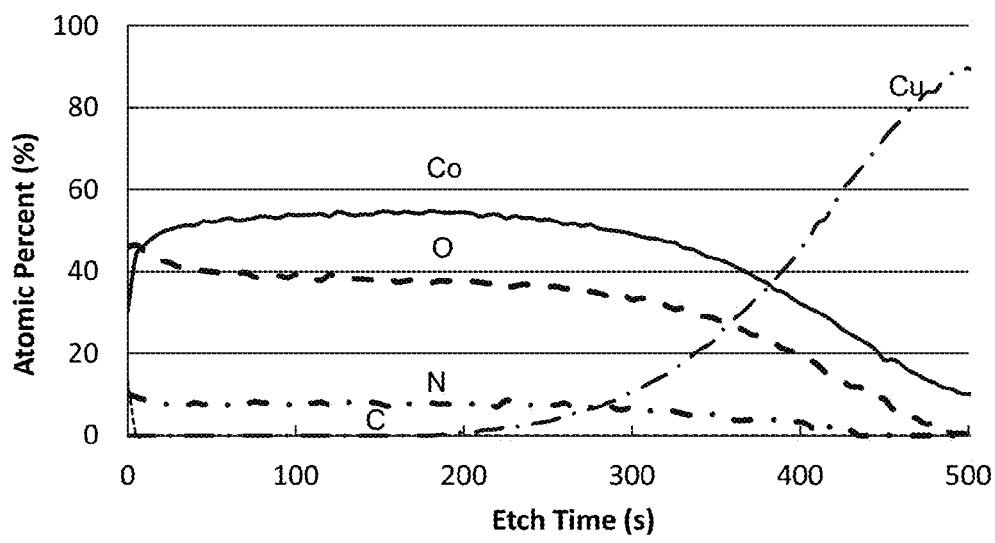
FIG. 22 is a XPS graph of a Co film deposited on a Cu substrate using an ALD deposition process.
Figure 23:
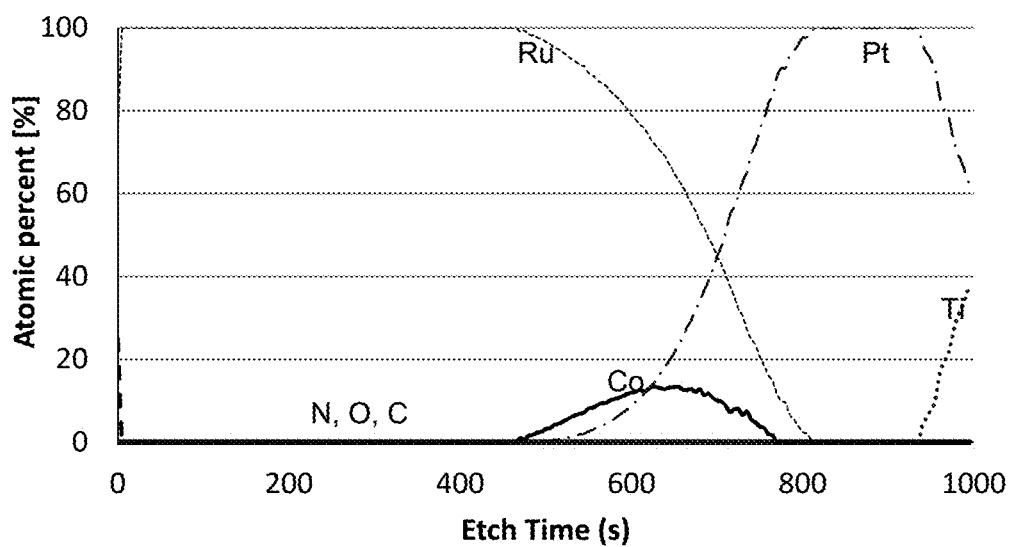
FIG. 23 is a XPS graph of a Co film deposited on a Pt substrate using an ALD deposition process.

FIG. 16 is a scanning electron microscope photograph of the film deposition on Si using the ALD deposition process. FIG. 17 is a scanning electron microscope photograph of the film deposited on $SiO_2$ using the ALD deposition process. FIG. 18 is a scanning electron microscope photograph of the film deposited on Cu using the ALD deposition process. FIG. 19 is a scanning electron microscope photograph of the film deposited on Pt using the ALD deposition process with ruthenium capping layer on it. FIG. 20 is a X-ray Photoelectron Spectroscopy (XPS) graph of the resulting Co film on Si. FIG. 21 is a X-ray Photoelectron Spectroscopy (XPS) graph of the resulting Co film on $SiO_2$. FIG. 22 is a X-ray Photoelectron Spectroscopy (XPS) graph of the resulting Co film on Cu. FIG. 23 is a X-ray Photoelectron Spectroscopy (XPS) graph of the resulting Co film on Pt with ruthenium capping layer on the top. One of ordinary skill in the art will recognize from FIG. 19 and FIG. 22 that the initial Co layer deposited on the Cu substrate included a large amount of oxygen, rendering the film porous. Further optimization of the deposition process may be possible.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in s examples given above and/or the attached drawings.

We claim:

1. A method of forming a cobalt-containing layer on a substrate contained in a reactor, the method comprising:
heating the substrate to a temperature ranging from approximately 30° C. to approximately 300° C.;
producing a nucleation layer on the substrate by a first vapor deposition process having a first deposition rate below 2 nm/min by introducing a vapor of $Co(CO)_3$(NO) and a reducing gas into the reactor; and
producing a remaining portion of the cobalt-containing layer on the nucleation layer by a second vapor deposition process having a second deposition rate greater than 2 nm/min by introducing the vapor of $Co(CO)_3$(NO) and the reducing gas into the reactor,
wherein the first deposition rate increases to the second deposition rate by increasing the temperature of the substrate, by increasing a partial pressure of the vapor of $Co(CO)_3$(NO), by increasing a pressure of the reactor, and/or by changing from an atomic layer or pulsed chemical vapor deposition process to a chemical vapor deposition process.

2. The method of claim 1, wherein the reducing gas is $H_2$ or $NH_3$.

3. The method of claim 1, wherein the cobalt-containing layer is a cobalt film.

4. The method of claim 1, further comprising annealing the nucleation layer under a reducing atmosphere at a temperature between 250° C. and 500° C.

5. The method of claim 1, further comprising annealing the cobalt-containing layer under a reducing atmosphere at a temperature between 250° C. and 500° C.

* * * * *